United States Patent
McGregor et al.

(10) Patent No.: US 6,362,064 B2
(45) Date of Patent: *Mar. 26, 2002

(54) ELIMINATION OF WALKOUT IN HIGH VOLTAGE TRENCH ISOLATED DEVICES

(75) Inventors: Joel M. McGregor, Los Altos; Rashid Bashir, Mountain View; Wipawan Yindeepol, San Jose, all of CA (US)

(73) Assignee: National Semiconductor Corporation, Santa Clara, CA (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/063,074

(22) Filed: Apr. 21, 1998

(51) Int. Cl.$^7$ .............................................. H01L 21/331
(52) U.S. Cl. ........................ 438/318; 257/487; 257/496; 257/565
(58) Field of Search .................... 257/487, 510, 257/491, 492, 493, 496, 524, 525, 565; 438/309, 311, 318

(56) References Cited

U.S. PATENT DOCUMENTS

| | | | | |
|---|---|---|---|---|
| 4,571,819 A | * | 2/1986 | Rogers et al. | 257/510 |
| 4,705,759 A | * | 11/1987 | Lidow et al. | 257/341 |
| 5,097,314 A | * | 3/1992 | Nakagawa et al. | 257/517 |
| 5,411,913 A | | 5/1995 | Bashiv et al. | 437/67 |
| 5,448,100 A | * | 9/1995 | Beasom | 257/487 |
| 5,592,015 A | | 1/1997 | Iida et al. | 257/524 |
| 5,644,157 A | * | 7/1997 | Iida et al. | 257/487 |
| 5,811,315 A | | 9/1998 | Yindeepol et al. | 437/62 |
| 5,914,523 A | | 6/1999 | Bashir et al. | 257/520 |

FOREIGN PATENT DOCUMENTS

| EP | 0653785 A2 | 5/1995 | H01L/21/74 |
|---|---|---|---|

OTHER PUBLICATIONS

Verwey, et al., *Drift of the Breakdown Voltage In p–n Junctions in Silicon (Walk–Out)*, Phillips Research Laboratories, Eindhoven, The Netherlands, Solid State Electronics, 1977, vol. 20, pp. 689–695.

Kurosawa, K. et al., *A New Bird's–Beak Free Field Isolation Technology for VLSI Devices*, Toshiba Research and Development Center, Toshiba Corporation, Kawasaki, Japan, IEDM81 pp. 384–387.

Rung, R. et al., *Deep Trench Isolated CMOS Devices* Toshiba Corporation, Semiconductor Device Engineering Laboratory, IEDM82, pp. 237–240.

(List continued on next page.)

*Primary Examiner*—Sara Crane
(74) *Attorney, Agent, or Firm*—Stallman & Pollock LLP

(57) ABSTRACT

Walkout in high voltage trench isolated semiconductor devices is inhibited by applying a voltage bias signal directly to epitaxial silicon surrounding the device. Voltage applied to the surrounding epitaxial silicon elevates the initial breakdown voltage of the device and eliminates walkout. This is because voltage applied to the surrounding epitaxial silicon reduces the strength of the electric field between the silicon of the device and the surrounding silicon. Specifically, application of a positive voltage bias signal to surrounding epitaxial silicon equal to or more positive than the most positive potential occurring at the collector during normal operation of the device ensures that no walkout will occur.

3 Claims, 8 Drawing Sheets

OTHER PUBLICATIONS

Lutze, J. et al., *Electrical Limitations of Advanced LOCOS Isolation for Deep Submicrometer CMOS*, IEEE Transactions on Electron Devices, vol. 38, No. 2, 1991 IEEE, pp. 242–245.

Tsang, et al., *Junction Breakdown Instabilities in Deep Trench Isolation Structure*, IEEE Transactions on Electron Devices, vol. 38, No. 9, Sep. 1991, pp. 2134–2138.

Poon S., et al., *A Trench Isolation Process for BiCMOS Circuits*, Advanced Products Research and Development Laboratory, Motorola Inc., 1993 IEEE, pp. 45–48.

Katsumata, N. et al, *Sub–20 ps ECL Bipolar Technology with High Breakdown Voltage*, ULSI Laboratories, Research and Development Center, Toshiba Corporation, Kawasaki, Japan, ESSDERC 1993, pp. 133–136.

* cited by examiner

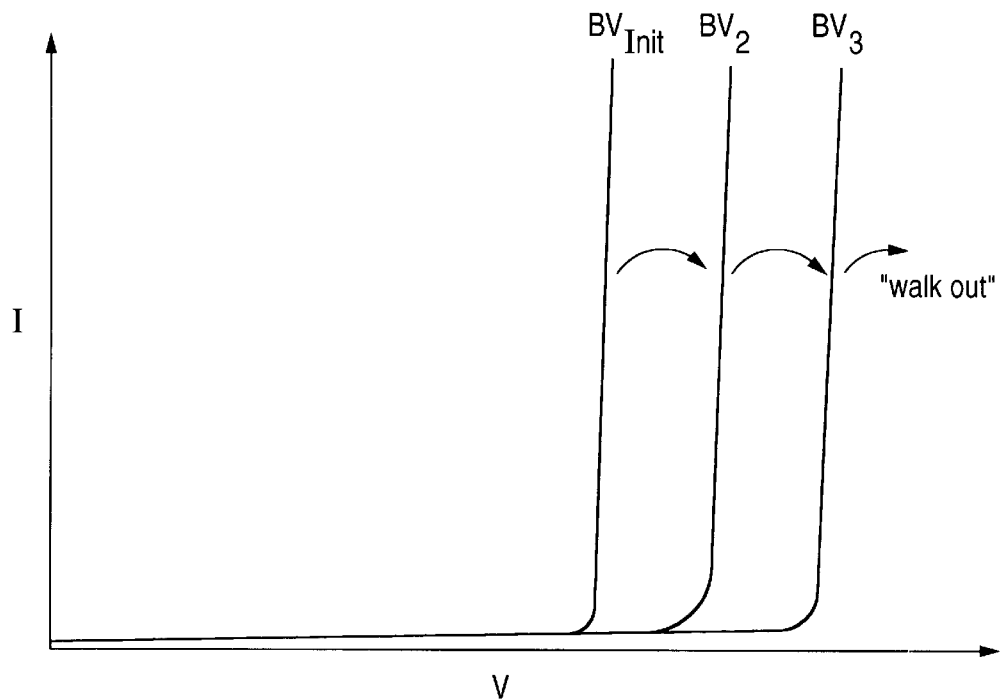
FIG. 2
(PRIOR ART)
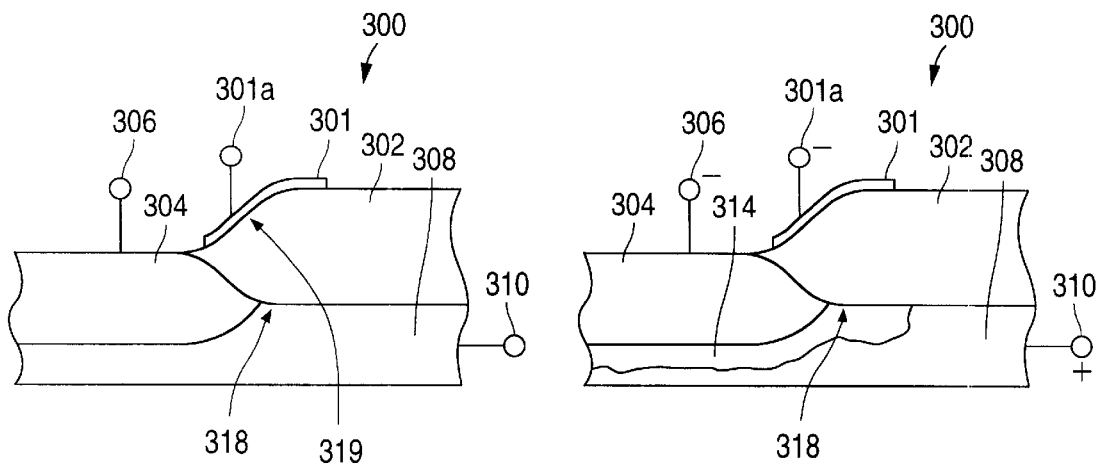
FIG. 3A
(PRIOR ART)
FIG. 3B
(PRIOR ART)

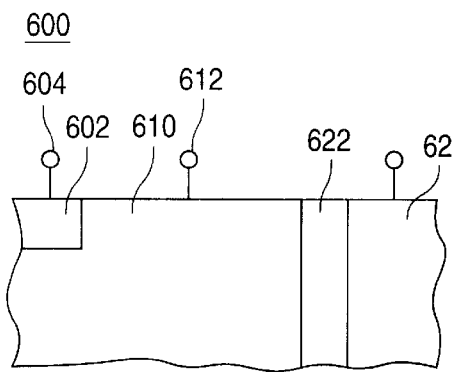
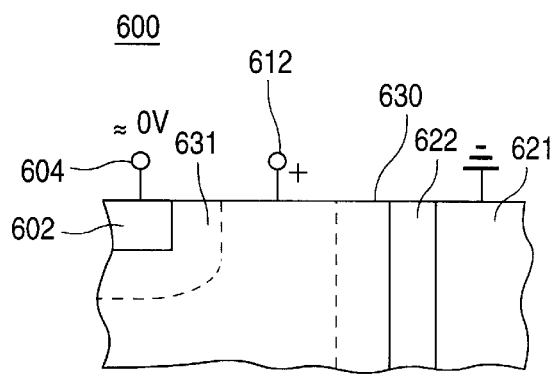
FIG. 6A  FIG. 6B
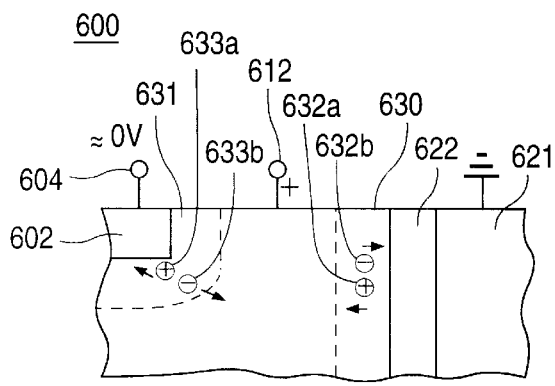
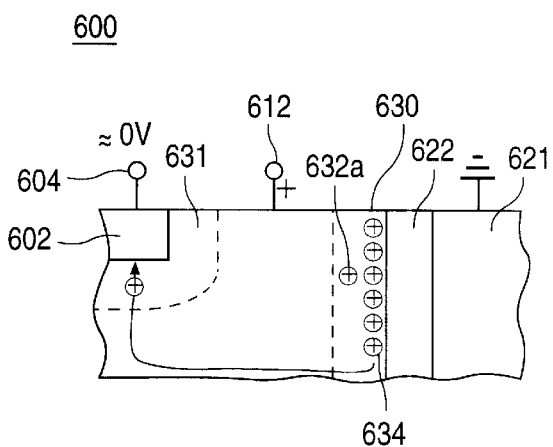
FIG. 6C  FIG. 6D
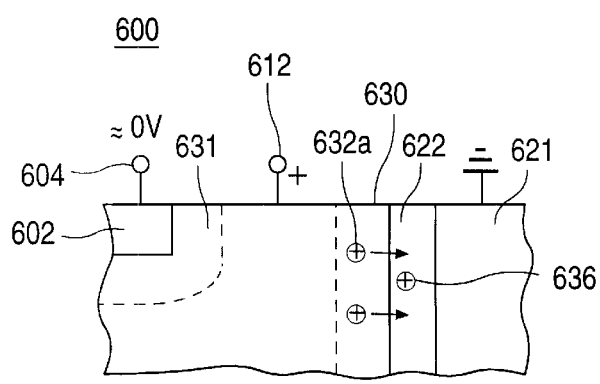
FIG. 6E

ELIMINATION OF WALKOUT IN HIGH VOLTAGE TRENCH ISOLATED DEVICES

BACKGROUND OF THE INVENTION

1. Field of the Invention

The present invention relates to the elimination of premature avalanche breakdown and subsequent breakdown voltage walkout in high voltage semiconductor devices, in particular, to eliminating premature initial breakdown and subsequent breakdown voltage walkout in trench isolated high voltage semiconductor devices by applying voltage directly to silicon adjacent to the trench isolating the device.

2. Description of the Related Art

The phenomenon of breakdown voltage "walkout" can present a serious problem to semiconductor designs that must exhibit a fixed initial breakdown voltage. Defined simply, "walkout" is the alteration in the breakdown voltage of a semiconducting device that results from at least one prior occurrence of avalanche breakdown.

FIGS. 1A–1F illustrate the phenomenon of walkout at the base-collector junction of a conventional LOCOS isolated NPN bipolar transistor.

FIG. 1A illustrates a cross-sectional view of the base/collector PN junction 100 of a conventional NPN bipolar transistor. The NPN bipolar transistor includes field oxide 102, a heavily doped p type base region 104, having base contact 106, and a lightly doped n type collector region 108 having a collector contact 110. For ease of illustration, collector contact 110 is shown as being on the side of collector 108, rather than at its actual location at the silicon surface.

As shown in FIG. 1B, when the base/collector PN junction is forward bias, a positive potential difference is applied between the base contact 106 and the collector contact 110. When the base/collector junction is biased in this manner, with the base contact at a more positive potential than the collector contact, holes 112 flow from base 104 to collector 108, and electrons 113 flow from collector 108 to base 104.

As shown in FIG. 1C, when the base/collector PN junction is reverse biased, a negative potential difference is applied between the base contact 106 and collector contact 110. When the base/collector junction is biased in this manner, with the collector contact at a more positive potential than the base contact, depletion region 114 in collector 108 and depletion region 115 in base 104 are formed. The potential difference between collector contact 110 and base contact 106 is dropped across the adjacent depletion regions 114–115.

The thickness of depletion regions 114 and 115 depends upon 1) the magnitude of the potential difference between collector contact 110 and base contact 106; and 2) the dopant concentrations of collector 108 and base 104. Because the dopant concentration of the collector (typically $10^{14}$–$10^{17}$ atoms/cm$^3$), is generally lower than the dopant concentration of the base (typically $5 \times 10^{17}$–$10^{19}$ atoms/cm$^3$) depletion region 114 formed in collector 108 is generally wider than depletion region 115 formed in base 104.

Under the reverse biased conditions described above, only a very small reverse current flows through the NPN transistor. However, if a large enough positive voltage difference is applied between collector contact 110 and base contact 106, avalanche breakdown of the PN junction will occur and substantial current will flow across the base/collector PN junction 100. FIG. 1D illustrates avalanche breakdown of base/collector PN junction 100.

Avalanche breakdown as shown in FIG. 1D is triggered when the electric field at any point within the depletion regions 114–115 exceeds a certain critical value. The dopant concentrations of collector 108 and base 104, and the junction depth of base 104 are among the factors which determine how large the potential difference between collector contact 110 and base contact 106 can be before the critical electric field is reached in any part of depletion regions 114–115.

During avalanche breakdown, electrical charge carriers can acquire high energy and be injected into the field oxide. These injected charge carriers can remain embedded and affect the conductivity of surrounding silicon regions.

FIG. 1E shows a cross-sectional view of the base/collector PN junction 100 following an avalanche breakdown event in which electrons 116 have been injected into the region 118 of field oxide 102 immediately adjacent to base/collector PN junction 100. FIG. 1F illustrates that upon reverse-biasing base/collector PN junction 100 of FIG. 1E, embedded electrons 116 distort the shape of depletion region 114. Their effect is to widen depletion region 114, and therefore, for a given potential difference between collector contact 110 and base contact 106, to reduce the peak electric field in the portion of depletion regions 114–115 adjacent to field oxide 102. Since the highest electric field in depletion regions 114–115 usually is located close to where PN junction 100 intersects the interface between silicon and field oxide 102, the embedded charge 116 has the effect of increasing the breakdown voltage of base/collector PN junction 100.

To summarize, following an initial avalanche breakdown that injects high energy carriers into an oxide, the breakdown voltage of a device can increase as the embedded carriers reduce the peak electric field near the field oxide.

The aforementioned increase in breakdown voltage is commonly known as "walkout". Walkout is illustrated graphically in FIG. 2. FIG. 2 plots voltage versus current in a semiconductor device that is experiencing walkout. FIG. 2 illustrates that following an initial avalanche breakdown event triggered by application of a first initial breakdown voltage ($BV_{init}$), the voltage required to recreate avalanche breakdown is increased, or "walked out", to a higher voltage ($BV_1$). FIG. 2 shows that subsequent breakdown events can result in a cumulative increase in breakdown voltage (i.e. $BV_{init} < BV_2 < BV_3$).

Field plates have conventionally been used to increase PN junction breakdown voltages by reducing electric field where a PN junction intersects an oxide/silicon interface. The use of a field plate for this purpose is shown in FIGS. 3A–3B.

FIG. 3A shows a cross-sectional view of the base/collector PN junction 300 of an NPN bipolar transistor equipped with a conductive field plate 301 having a field plate contact 301a. Conductive field plate 301 is in contact with surface portion 319 of field oxide 302 proximate to the field oxide/silicon interface 318. FIG. 3B shows that if field plate contact 301A is held at the same potential as base contact 306, while base/collector PN junction 300 is reverse biased, the width of depletion region 314 proximate to field oxide/silicon interface 318 is increased. This reduces the peak electric field in the portion of depletion region 314 proximate to field oxide/silicon interface 318, and therefore increases the breakdown voltage of base/collector PN junction 300.

The effect of the field plate is very similar to the effect of embedded negative charge shown in FIG. 1F. Though the field plate is usually electrically connected to base contact 306, it may be independently biased. As long as the bias on the field plate is less positive than the bias on the collector contact 310, the effect will be to increase the breakdown voltage of base/collector PN junction 300.

FIGS 1A–1F and FIGS. 3A–3B depict only the base/collector junction of an NPN bipolar transistor. However, if trench isolation is used to isolate individual transistors in an integrated circuit, the avalanche breakdown determining the highest collector voltage may occur initially not at the base/collector PN junction, but proximate to the trenches which isolate the individual transistors.

FIG. 4 illustrates a plan view of a high voltage trench isolated NPN bipolar transistor 400. High voltage trench isolated transistor 400 includes a heavily doped n type emitter region 402 having an emitter contact 404, formed within p type base region 406 having base contact 408. P type base region 406 is itself formed within n type collector region 410 including n+ collector contact region 411 having collector contact 412. High voltage NPN transistor 400 is electrically isolated from surrounding silicon 421 by the trench isolation structure 422.

If the surrounding silicon region 421 is at an electrical potential lower than the potential applied to collector contact 412, the potential difference between surrounding silicon 421 and collector contact 412 will be dropped partly across trench isolation structure 422, and partly across space-charge regions formed in the silicon on either side of the trench (depleted or accumulated silicon present either in collector region 410 adjacent to the trench, or in surrounding silicon region 421 adjacent to the trench). The electric field will be strongest in the corners 408a.

The precise mechanism causing premature breakdown at trench corners and subsequent breakdown voltage walkout in trench isolated high voltage NPN transistor 400 can be explained by reference to FIGS. 5A–5D and 6A–6E.

FIGS. 5A–5D show cross-sectional views of a portion of a generic trench isolated device that includes a border region 500 between an n type doped area 510, a trench isolation structure 522, and surrounding silicon 521.

FIG. 5A shows border region 500 with no potential difference applied between n doped area 510 or surrounding silicon 521. FIG. 5B shows the application of a positive voltage to n doped area 510 while surrounding silicon 521 remains at ground potential. Under these conditions, a depletion region 530 is formed in n type region 510 proximate to insulating trench 522. The potential difference applied between the n-type region 510 and surrounding silicon region 521 is dropped partly across the trench isolation structure 522, and partly across the depletion region 530, which has a positive space charge because it is depleted of free electrons. Electron/hole pairs 532b-532a are thermally generated in depletion region 530.

FIG. 5C shows that under the influence of the electric field in depletion region 530, thermally generated holes 532a are swept towards the grounded surrounding silicon 521, while thermally generated electrons 532b are swept towards contact 512, which is at a positive potential. Blocked by the insulating trench 522, the thermally generated holes 532a gather in an inversion layer 534 adjacent to insulating trench 522. As more holes gather in inversion layer 534, more of the applied voltage between contact 512 and surrounding silicon region 521 is dropped across insulating trench 522, and correspondingly less of the applied voltage is dropped across depletion region 530. The width of depletion region 530 decreases with the increased number of holes in inversion layer 534.

FIG. 5D shows that eventually, when a steady state has been reached, enough holes gather in inversion layer 534 so that essentially all of the applied voltage difference between contact 512 and surrounding silicon 521 drops across trench isolation structure 522, and depletion layer 530 is very narrow. The time required after application of a potential difference between contact 512 and surrounding region 521 to reach a steady state depends on the thermal generation rate of electron/hole pairs in depletion layer 530. If the initial width of depletion layer 530 is large enough to cause a field higher than the critical field for avalanche breakdown, the initial current transient will be fast. However, after the peak field in depletion layer 530 drops below the critical field for avalanche breakdown, the current created by generated electron/hole pairs is low, meaning that the transient current which builds up inversion layer 534 is slow. After this transient, no steady-state current flows.

However, such is not necessarily the case for a trench isolated high voltage NPN bipolar transistor. FIGS. 6A–6E show cross-sectional views of a portion of a trench isolated NPN bipolar transistor device that includes a border region 600 between an n type doped area 610 having a p type base 602, a trench isolation structure 622, and surrounding silicon 621.

FIG. 6A shows a cross-section of part of the transistor 600, with a p type base 604 contacted by a base contact 602. In FIG. 6A no potential is applied to the base contact 604, the collector contact 612, or the surrounding region 621. FIG. 6B shows a positive voltage applied to collector contact 612, surrounding region 621 at ground potential, and base contact 604 at a potential very close to ground. Two depletion layers are formed within the n type collector region 610: a depletion layer 630 adjacent to the sidewall of trench isolation structure 622, and a depletion region 631 adjacent to the p type base 602.

FIG. 6C shows that if there is a positive potential difference between collector contact 612 and base contact 604, and between collector contact 612 and surrounding region 621, electron/hole pairs 632b/a and 633b/a are thermally generated in the depletion regions 630 and 631. In depletion region 630 adjacent to insulating trench 622, generated electrons 632b are swept towards the collector contact 612 and generated holes are swept toward the surrounding region 621. In depletion region 631, generated electrons are swept toward the collector contact 612 and generated holes are swept towards the base region 602. If, for any given voltage on the collector contact 612, the peak electric field in depletion region 630 is higher than the peak electric field in depletion region 631, then avalanche breakdown will occur in region 630 before it occurs in region 631.

FIG. 6D illustrates the undesirable situation in which avalanche breakdown occurs in depletion region 630 adjacent to insulating trench 622, before it occurs in depletion region 631 adjacent to base region 602. Although it is not shown on FIG. 6D, on sides of the transistor region which do not have a heavily doped collector contact region adjacent to them, depletion regions 630 and 631 actually merge. Holes 632a which are swept to the insulating trench 622 build up into an inversion layer 634 because they cannot pass through the insulating trench 622. This inversion layer is distributed over all four trench sidewalls. On sidewalls close to base 602, inversion layer 634 cannot build up to the extent that it did in FIG. 5D. This is because holes are continually swept into base 602 since depletion region 631 is continuous with depletion layer 630 where no heavily doped collector contact region is interposed between base 602 trench isolation structure 622. In this situation there is a large continuous avalanche current between collector 612 and base 604, because an inversion layer 634 cannot build up to the extent necessary to drop most of the potential difference between collector 612 and surrounding region 621 across trench 622, rather than across depletion layer 630. The electric field in depletion region 630 remains high enough to cause continuing avalanche breakdown.

In fact, the situation of FIG. 6D will not continue indefinitely. As shown in FIG. 6E, some avalanche generated holes 632a will have enough energy to become embedded in the oxide of insulating trench 622. This fixed positive charge 636 will increase the electric field in insulating trench 622 and decrease the electric field in depletion region 630. The effect of this is a slow increase in breakdown voltage, which appears as a "walkout", as shown in FIG. 2.

Given that the avalanche current described in FIGS. 6A–6E lasts until the breakdown voltage walks out to the applied collector voltage, a process that can take several seconds or minutes, the premature breakdown described in FIGS. 6A–6E can be a serious problem in high voltage trench isolated NPN bipolar transistors.

The above-described mechanism of walkout in high voltage trench isolated NPN bipolar transistors is confirmed by experimental evidence. One by-product of avalanche breakdown is the emission of infrared light. During breakdown of high voltage trench isolated NPN bipolar transistors as described in FIG. 4 and FIGS. 6A–6E, particularly high infrared intensities have been observed in the corners at the interface with the trench sidewalls.

Therefore, there is a need in the art for methods and structures for eliminating breakdown voltage walkout in high voltage trench isolated semiconductor devices.

SUMMARY OF THE INVENTION

The present invention relates to preventing walkout in trench isolated semiconductor devices by biasing silicon adjacent to the trench isolation structure of the device. As a result of the direct application of voltage to adjacent silicon, premature breakdown at trench corners is prevented.

Voltage applied to the surrounding epitaxial silicon elevates the initial breakdown voltage of the device and eliminates walkout by reducing the strength of the electric field between the silicon of the device and the surrounding silicon. Specifically, application of a positive voltage to surrounding silicon that is equal to or more positive than the most positive potential occurring at the collector during normal operation of a high voltage trench isolated NPN bipolar transistor, ensures that no walkout will occur in the device.

An isolation structure for a semiconductor device in accordance with one embodiment of the present invention includes a silicon material having a surface, a semiconductor device formed within the silicon material, and a substantially vertical trench isolation structure circumscribing the semiconductor device and extending from the surface of the silicon material to a depth into the silicon material. An electrical contact is positioned in the silicon material surrounding the device at a location outside of the trench isolation structure. The contact for the surrounding silicon is disposed so as to permit the application of a bias voltage to semiconductor material outside of the trench isolation structure. This voltage bias signal is of sufficient magnitude to maintain an electric field across the trench isolation structure below the critical field strength for avalanche breakdown.

A better understanding of the features and advantages of the present invention will be obtained by reference to the following detailed description and accompanying drawings that set forth an illustrative embodiment in which the principles of the invention are utilized.

BRIEF DESCRIPTION OF THE DRAWINGS

FIG. 2 plots voltage versus current in a semiconductor device that is experiencing walkout.

FIGS. 3A–3B are cross-sectional views of the base/collector PN junction of a field oxide isolated NPN bipolar transistor that is equipped with a field plate.

FIGS. 6A–6E show cross-sectional views of a portion of a trench isolated NPN bipolar transistor device that includes a border region between an n type doped area having a p type base, a trench isolation structure, and surrounding silicon.

DETAILED DESCRIPTION

Figure 1A:
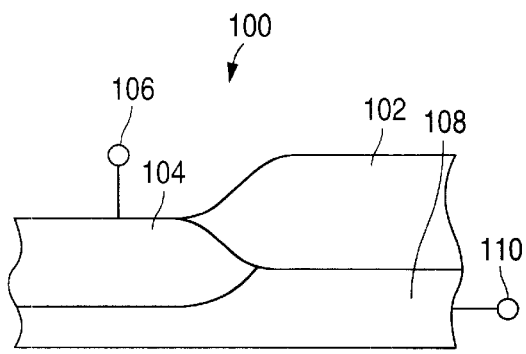
FIGS. 1A–1F are cross-sectional views of the base/collector PN junction of a field oxide isolated NPN bipolar transistor, illustrating the phenomenon of walkout.
Figure 1B:
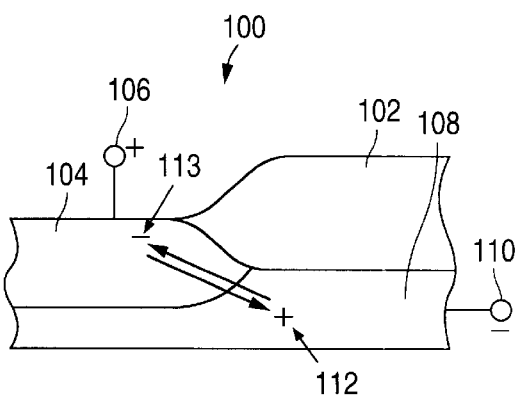
Figure 1C:
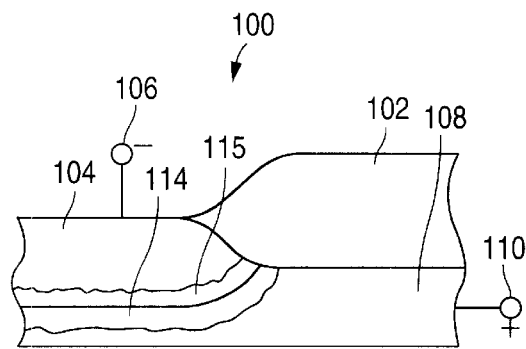
Figure 1D:
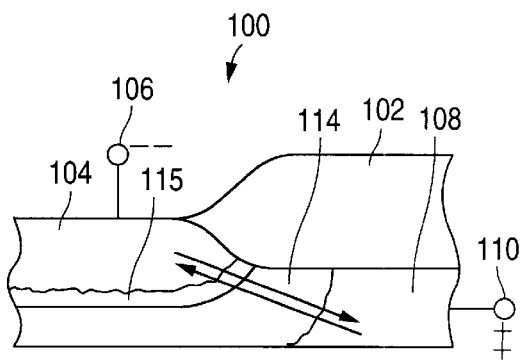
Figure 1E:
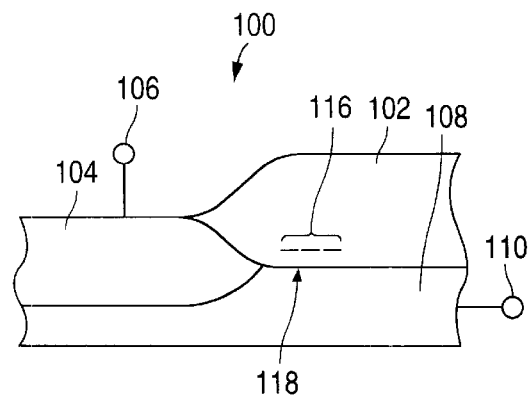
Figure 1F:
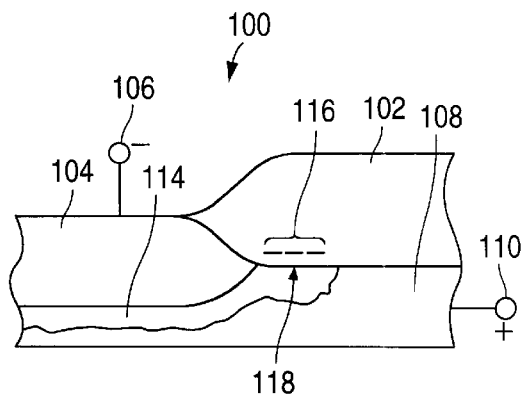
Figure 4:
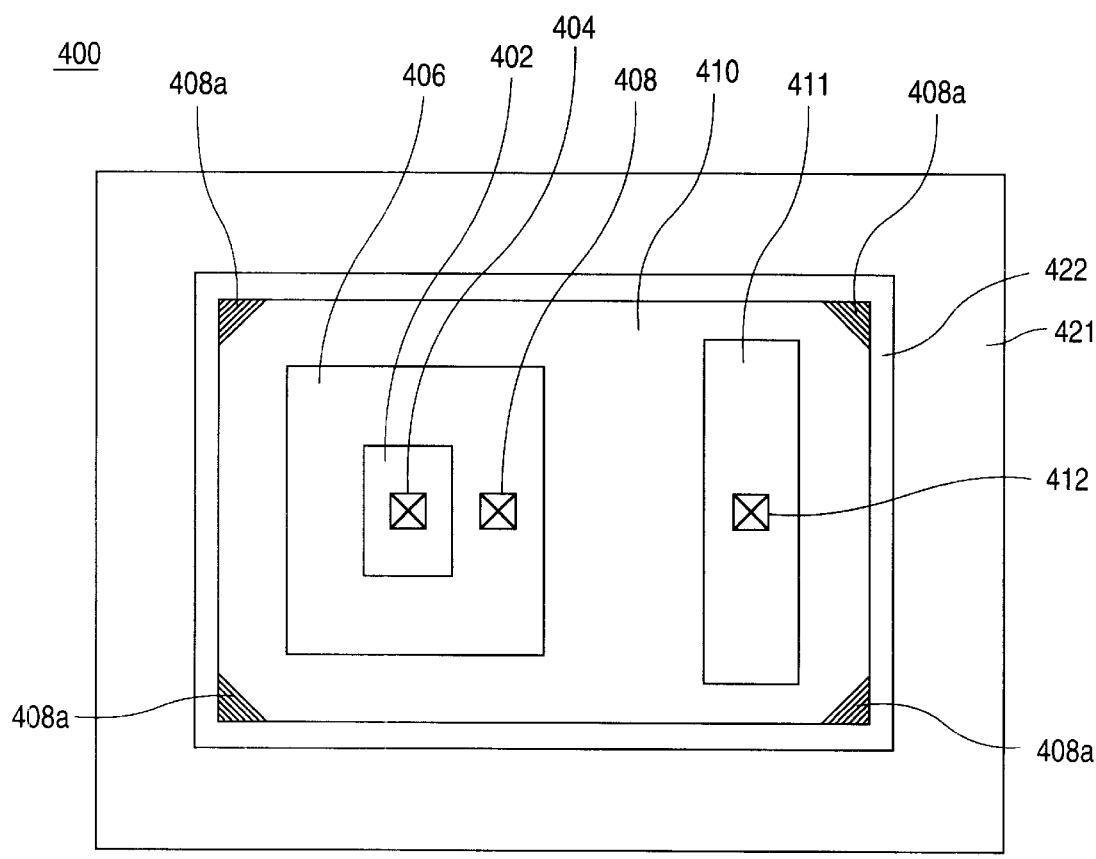
FIG. 4 is top view of a trench isolated high voltage NPN bipolar transistor.
Figure 7C:
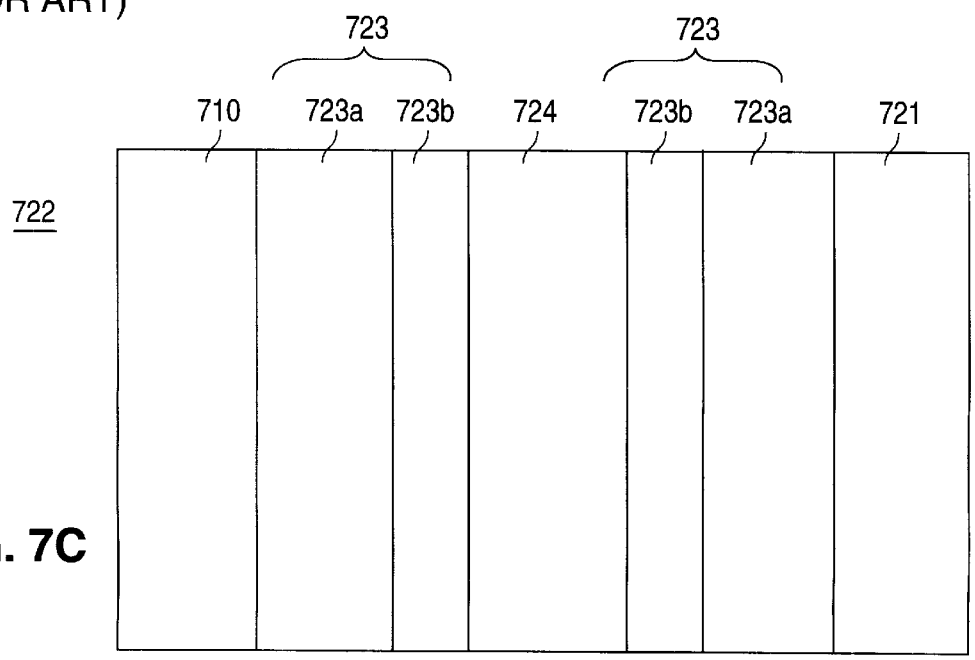
FIG. 7C is a detailed cross-sectional view of the trench isolation structure shown in FIGS. 7A and 7B.
Figure 5A:
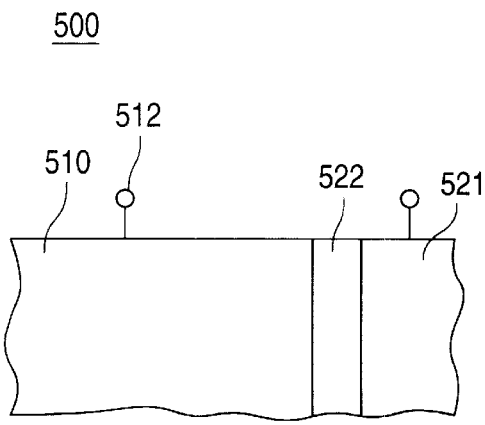
FIGS. 5A–5D show cross-sectional views of a portion of a generic trench isolated device that includes a border region between an n type doped area, a trench isolation structure, and surrounding silicon.
Figure 5B:
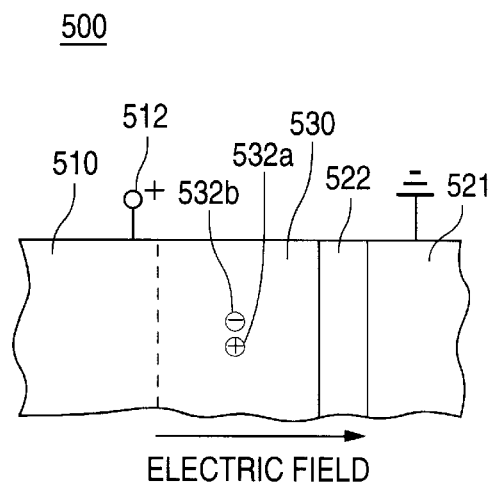
Figure 5C:
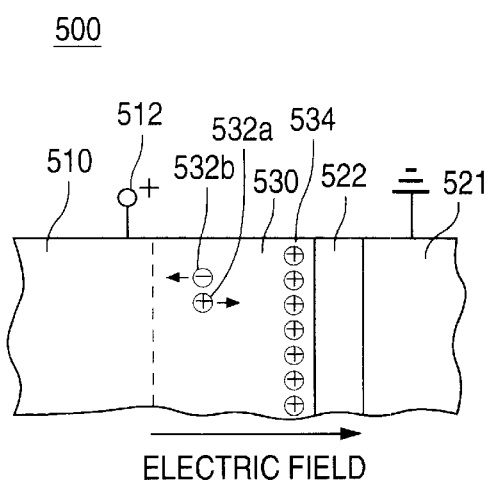
Figure 5D:
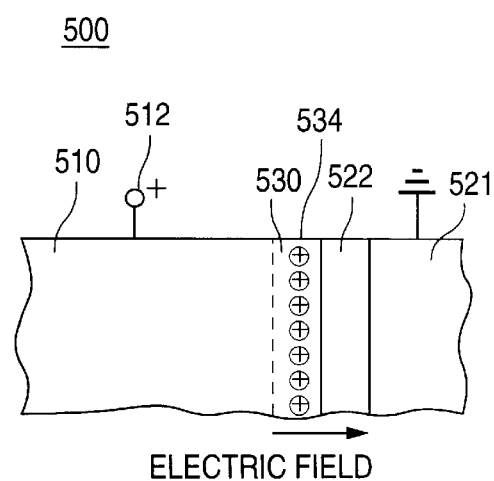
Figure 7A:
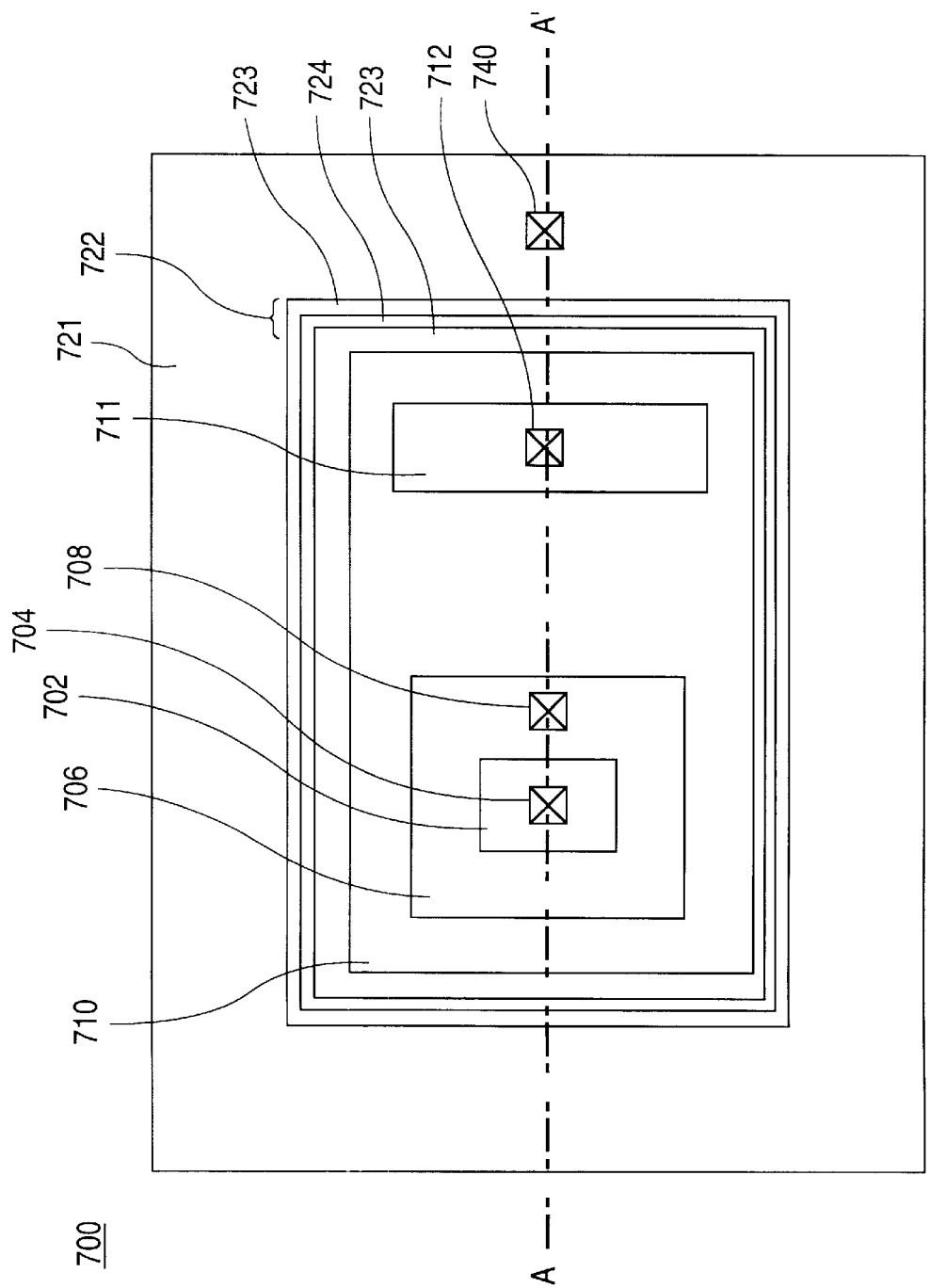
FIG. 7A is a top view of a trench isolated high voltage NPN bipolar transistor in accordance with a first embodiment of the present invention.

FIG. 7A shows a top view of a trench isolated high voltage NPN bipolar transistor 700 in accordance with one embodiment of the present invention.

Trench isolated high voltage NPN bipolar transistor 700 includes heavily doped n type 160 $\mu m^2$ emitter region 702 having an emitter contact 704, formed within p type base region 706 having base contact 708. P type base region 706 is itself formed within n type collector region 710 having n type collector contact region 711 and collector contact 712.

NPN bipolar transistor 700 is electronically isolated from surrounding epitaxial silicon 721 by conventional field oxide (not shown) and underlying trench isolation structure 721 comprising trench fill polysilicon layer 724 sandwiched between trench liner layers 723. Epitaxial silicon 721 surrounding high voltage device 700 bears epitaxial contact 740.

Figure 7B:
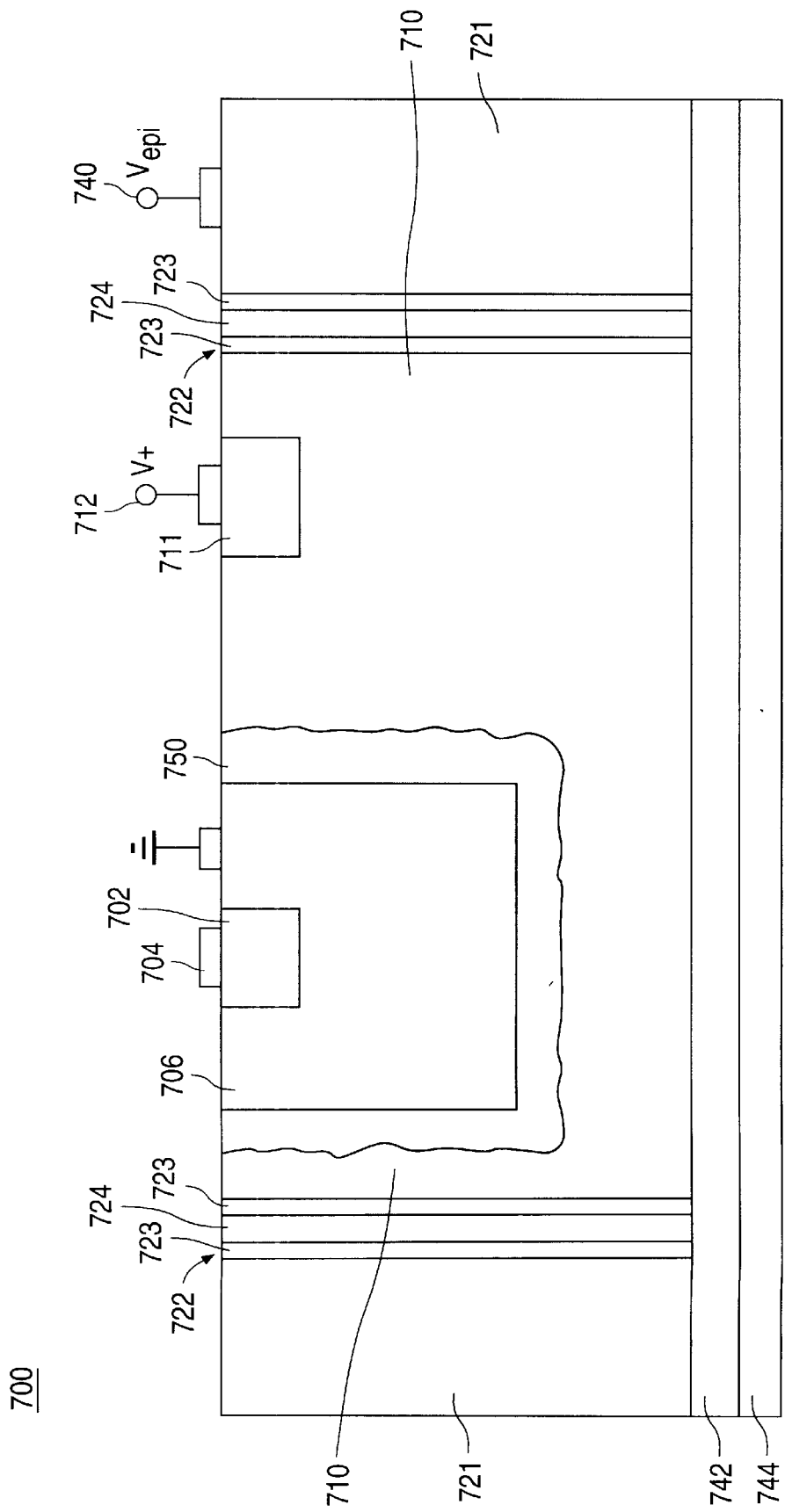
FIG. 7B is a cross-sectional view along line A–A' of the trench isolated high voltage NPN bipolar transistor shown in FIG. 7A.

FIG. 7B shows a cross-sectional view of high voltage bipolar transistor 700 along line A–A' of FIG. 7A. FIG. 7B reveals that bipolar transistor 700 is further isolated from underlying silicon 744 by horizontal buried oxide layer 742.

FIG. 7C is a detailed cross-sectional view of trench isolation structure 722 shown in FIGS. 7A and 7B. Trench isolation structure 722 consists of substantially vertical 1μ wide trench fill polysilicon layer 724 sandwiched between trench liner layers 723, each trench liner layer 723 comprising a substantially vertical 4700 Å wide trench liner oxide layer 723a and a substantially vertical 0.2µ wide silicon nitride liner layer 723b that separates trench liner oxide layer 723a from adjacent trench fill polysilicon layer 724.

FIG. 7B shows that application of a positive voltage $V_{epi}$ to contact 740 of surrounding epitaxial silicon 721 elevates the initial breakdown voltage, and eliminates walkout in high voltage trench isolated NPN bipolar transistor 700. Specifically, grounding base contact 708 during application of a positive voltage $V_{epi}$ to contact 740 that is equal to or more positive than the most positive potential (V+) occurring at the collector 710 during normal operation of device 700, ensures that no walkout will occur. While a depletion region 750 will form in collector 710 around base 706, the positive voltage $V_{epi}$ applied to the surrounding silicon 721 will reduce the electric field that arises between n type collector 710 and surrounding silicon 721 when a positive bias is applied to n type collector 710. This reduced electric field in turn inhibits the occurrence of avalanche breakdown.

To summarize: breakdown voltage is increased and walkout prevented in a high voltage trench isolated NPN bipolar transistor by applying a positive voltage to the surrounding silicon outside of the trench. This positive bias reduces or eliminates the electric field arising between the high voltage collector and the formerly low voltage epitaxial silicon surrounding the device.

Table 1 shows the initial walkout voltage ($BV_{init}$) of high voltage NPN bipolar transistor 700, versus the voltage applied to the adjacent epitaxial silicon ($V_{epi}$). In table 1, $BV_{init}$ is the same as the collector-emitter breakdown voltage where the base is shorted to the emitter ($BV_{ces}$).

TABLE 1

$V_{epi}$ vs. $BV_{init}$

| $V_{epi}$ (V) | $BV_{init}$ (V) |
|---|---|
| −40 | 100 |
| 0 | 140 |
| 40 | 180 |
| 100 | 225 |

Table 1 reveals that increasing $V_{epi}$ from 0V to +100V increases $BV_{init}$ from 140V to 225V. By contrast, table 1 also reveals that decreasing $V_{epi}$ from 0V to −40V lowers $BV_{init}$ from 140V to 100V.

Figure 8A:
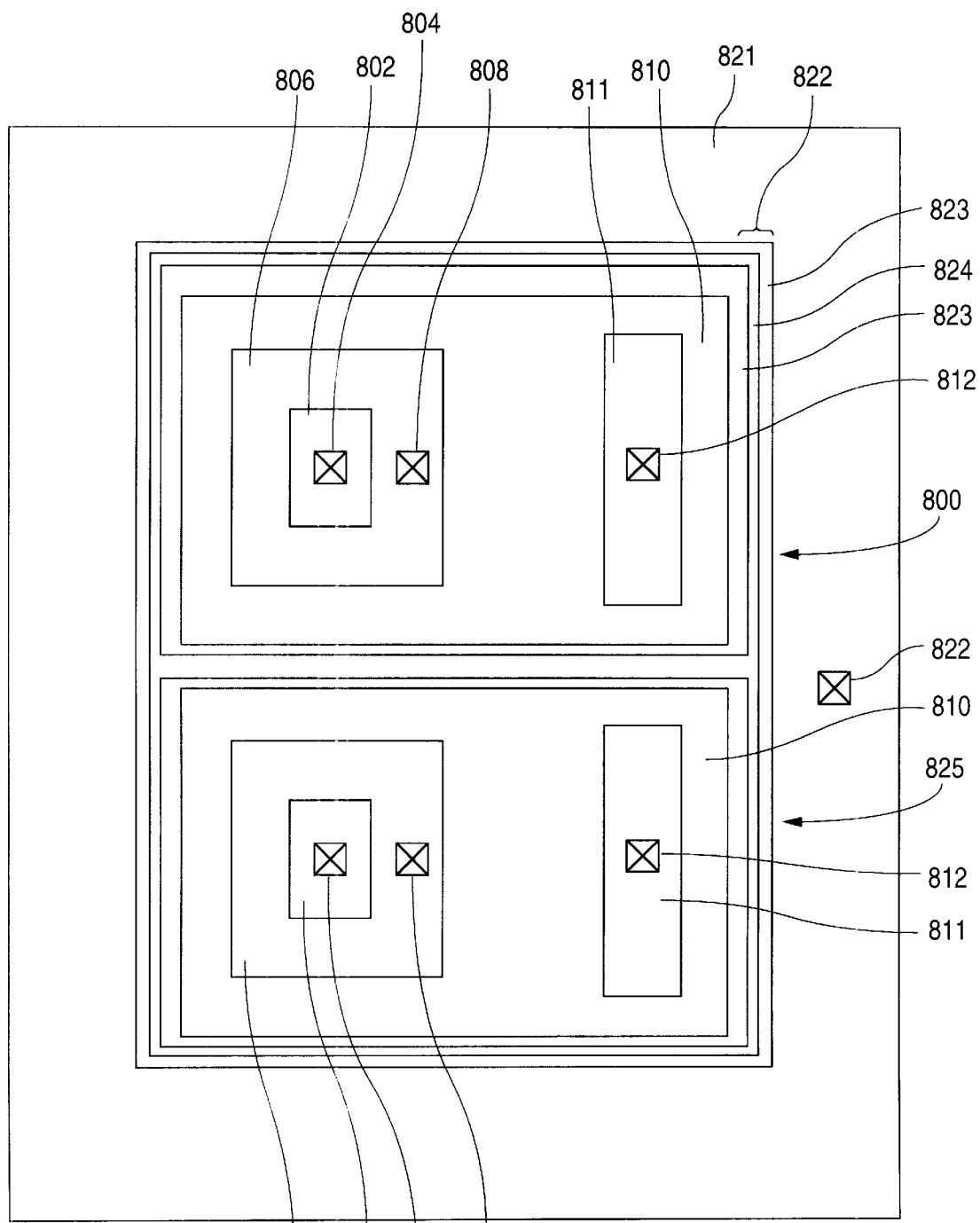
FIG. 8A is a top view of an arrangement of adjacent trench isolated high voltage NPN bipolar transistors in accordance with a second embodiment of the present invention.
Figure 8B:
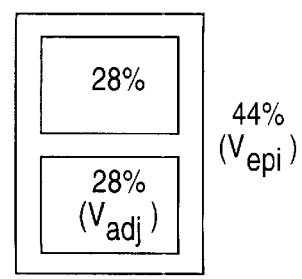
FIG. 8B graphically illustrates the percentage of the total perimeter of the trench isolated structure of FIG. 8A that is bordered by the high voltage NPN transistors and the surrounding silicon.

FIG. 8A shows an arrangement of adjacent high voltage NPN bipolar transistors in accordance with a second embodiment of the present invention. FIG. 8B graphically illustrates the percentage of the total perimeter (combined exterior and interior) of the trench isolated structure of FIG. 8A that is bordered by the adjacent high voltage NPN transistors and the surrounding epitaxial silicon.

Adjacent high voltage trench isolated NPN bipolar transistors 800 and 825 each include a heavily doped n type 160 µm² emitter region 802 having an emitter contact 804, formed within p type base region 806 having base contact 808. P type base region 806 is itself formed within n type collector region 810 including collector contact region 811 having collector contact 812.

High voltage NPN bipolar transistors 800 and 825 share a common trench isolation structure 822. As shown in FIG. 8B, considering both the inner and outer perimeters of trench isolation structure 822, 28% is in electrical contact with each of the collectors 810 of high voltage trench isolated NPN bipolar transistors 800 and 825. The remaining 44% of the total perimeter of trench isolation structure 822 is in electrical contact with the surrounding epitaxial silicon 821.

Trench isolation structure 822 consists of a trench fill polysilicon layer 824 sandwiched between trench liner layers 823 that includes a trench oxide liner layer (not shown) and a silicon nitride liner layer (not shown). Where trench fill polysilicon layer 824 is not grounded, trench fill polysilicon layer 824 will "float". Since trench fill polysilicon layer 824 is a conductor (albeit a poor one), floating trench fill polysilicon layer 824 achieves and maintains a uniform potential determined by the potential of all the silicon around it.

Because of the interposition of trench fill polysilicon layer 824 between collector 810 and surrounding epitaxial silicon 821, the electric field that gives rise to walkout in adjacent high voltage trench isolated NPN bipolar transistors 800 and 825 is the field that arises between the respective NPN collectors 810 and the floating trench fill polysilicon layer 824. Therefore, the $BV_{init}$ of high voltage trench isolated NPN bipolar transistor 800 can be raised in accordance with the present invention by positively biasing the collector of adjacent transistor 825 ($V_{adj}$), while leaving surrounding epitaxial silicon 821 grounded. The increase in $BV_{init}$ obtained by applying $V_{adj}$ supplements any effect upon $BV_{init}$ obtained by positively biasing the surrounding epitaxial silicon 821 with a $V_{epi}$.

Table 2 shows the effect upon $BV_{init}$ of high voltage trench isolated NPN bipolar transistor 800 resulting from the application of a variety of $V_{epi}$ and $V_{adj}$ voltage combinations.

TABLE 2

Effect $V_{epi}$, and $V_{adj}$, on $BV_{init}$.
Trench Liner Oxide Width = 4700Å

| Combination | $V_{epi}$ (V) | $V_{adj}$ (V) | $BV_{init}$ (V) |
|---|---|---|---|
| 1 | 0 | 0 | 120 |
| 2 | 0 | 100 | 160 |
| 3 | 100 | 0 | 190 |
| 4 | 100 | 40 | 210 |

Table 2 reveals that application of either $V_{adj}$ or $V_{epi}$ resulted in an increase of $BV_{init}$. Moreover, combined application of $V_{epi}$ and $V_{adj}$ raised $BV_{init}$ to even higher levels than either $V_{epi}$ or $V_{adj}$ alone.

Comparison of combinations 2 and 3 reveals that application of a 100V $V_{epi}$ raised $BV_{init}$ more (+70V) than application of a 100V $V_{adj}$ (+40V). The larger impact of $V_{epi}$ versus $V_{adj}$ is likely due to the larger amount of the total perimeter of trench isolation structure 822 exposed to $V_{epi}$ (44%) than exposed to $V_{adj}$ (28%). This conclusion is roughly confirmed by comparing the ratio of the exposed trench perimeter to the ratio in increase in $BV_{init}$:

$$\frac{\%\ \text{perimeter exposed to}\ V_{epi}}{\%\ \text{perimeter exposed to}\ V_{adj}} = \frac{.44}{.28} = 1.57 \approx 1.75 = \frac{+70V}{+40V}$$

The various features of the present invention have been illustrated with regard to a trench isolated high voltage NPN bipolar transistor in accordance with one embodiment of the present invention. However, the features and advantages offered by the structures and methods of the present invention should not be limited to this particular embodiment.

For example, while the particular embodiment of an NPN bipolar transistor in accordance with the present invention is illustrated by the application of voltage to adjacent epitaxial silicon, the present invention is equally applicable to control walkout by biasing non-epitaxial silicon, such as the single crystal silicon of a silicon substrate.

And while the particular embodiment of the present invention is illustrated by the application of bias to control walkout in an NPN bipolar transistor, the present invention is also applicable to control walkout in a corresponding PNP bipolar transistor. Of course, the PNP transistor structure would have relative voltages and conductivity types reversed as compared with NPN bipolar transistor 500 described above in connection with FIGS. 5 and 6.

Moreover, the present invention is not limited to controlling walkout in high voltage bipolar transistor devices. Other semiconductor structures requiring trench isolation, such as high voltage CMOS and DMOS devices, may also be suitable for isolation utilizing the methods and structures in accordance with the present invention.

Therefore, it is intended that the following claims define the scope of the invention, and that methods and structures falling within the scope of these claims and their equivalents be covered thereby.

What is claimed is:

1. A method of preventing premature breakdown and subsequent breakdown voltage walkout in a trench isolated bipolar transistor, the method comprising:
   (a) providing a trench isolated bipolar transistor structure that includes a layer of semiconductor material
      (i) a layer of semiconductor material having a horizontal buried dielectric layer formed beneath an upper surface of said layer of semiconductor material;
      (ii) a dielectric isolation structure formed to extend from the upper surface of said layer of semiconductor material to the horizontal buried dielectric layer, thereby defining an informed active device region that is surrounded by the dielectric isolation structure and the horizontal buried dielectric layer and an external region of semiconductor material;
      (iii) a bipolar transistor structure formed in the internal active device region, the bipolar transistor structure including in emitter region having a first conductivity type formed within a base region having a second conductivity type opposite the first conductivity type formed within a collector region having a first conductivity type, the collector region including a collector contact region;
      (iv) a collector contact connected to the collector contact region;
      (v) an external contact connected to the external region of semiconductor material; and
      (vi) a base region contact connected to the base region
   (b) applying a first voltage to the collector contact; and
   (c) simultaneously with the step of applying a first voltage to the collector contract, applying a second voltage to the external contact, the second voltage being equal to or more positive than the first voltage and applying a third voltage to the base contact that is more negative than both the first voltage and the second voltage.

2. The method of claim 1, and wherein the bipolar transistor is a NPN bipolar transistor.

3. The method of claim 1, and wherein the bipolar transistor is a PNP bipolar transistor.

* * * * *